(12) United States Patent
Chang

(10) Patent No.: US 9,256,133 B2
(45) Date of Patent: Feb. 9, 2016

(54) APPARATUS AND METHOD FOR DEVELOPING PROCESS

(75) Inventor: Ching-Yu Chang, Yuansun Village, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 13/548,557

(22) Filed: Jul. 13, 2012

(65) Prior Publication Data

US 2014/0017616 A1  Jan. 16, 2014

(51) Int. Cl.
*H01L 21/47* (2006.01)
*G03F 7/30* (2006.01)

(52) U.S. Cl.
CPC ............... *G03F 7/3021* (2013.01); *G03F 7/30* (2013.01)

(58) Field of Classification Search
USPC .......................................... 430/396, 394, 325
See application file for complete search history.

(56) References Cited

U.S. PATENT DOCUMENTS

2010/0261122 A1* 10/2010 Inatomi ......................... 430/325

* cited by examiner

*Primary Examiner* — Daborah Chacko Davis
(74) *Attorney, Agent, or Firm* — Haynes and Boone, LLP

(57) ABSTRACT

An apparatus includes at least two tanks, at least two pumps, at least one nozzle, and a chuck. The apparatus provides multiple developers with different polarities during a developing process to target portions of a latent resist profile having different polarities, and thus different solubility. This apparatus also allows a mixture of two developers to be used for the resist film developing. A polarity of the mixture is adjustable by controlling a ratio of one pump flow rate to another pump flow rate and further controlling the resist pattern profile.

19 Claims, 5 Drawing Sheets

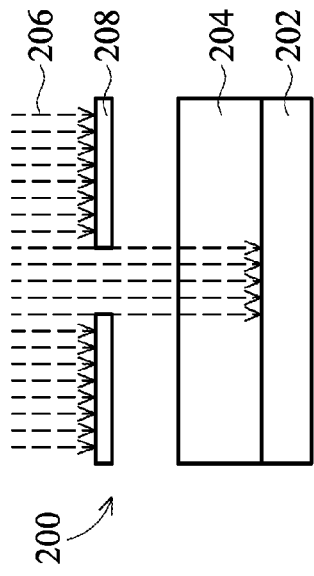
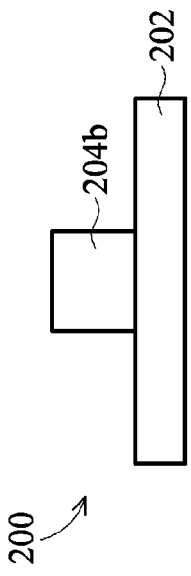
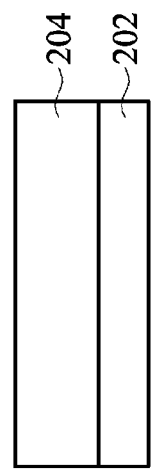
FIG. 2
FIG. 3
FIG. 4
FIG. 5
FIG. 6

APPARATUS AND METHOD FOR DEVELOPING PROCESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography processes often implement exposing and developing processes to pattern small features during IC wafer fabrication and mask fabrication. One of the challenges that arise during the lithography processes is that latent pattern resist profiles formed by the exposing process have different polarity at different portions of the resist profiles. Such polarity differences are caused by light scattering and reflecting at the top and the bottom of a resist film during the exposing process. The different portions of the different polarity have a different solubility to an organic solvent developer used during the developing process, oftentimes resulting in a resist pattern profile with top scum (T-top) and bottom scum (footing).

Accordingly, what is needed is an apparatus and a method that address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-6 are diagrammatic cross-sectional side views of forming a resist pattern according to one or more embodiments of the present disclosure.

DETAILED DESCRIPTION

Figure 1:
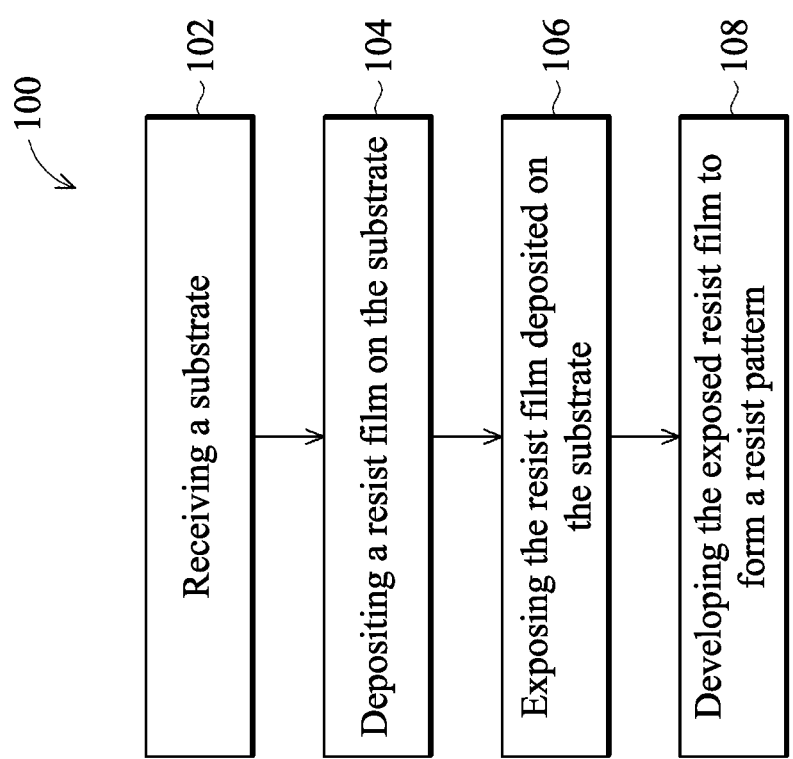
FIG. 1 is a flow chart of a method for forming a resist pattern for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a flow chart of a method 100 is an example of forming a resist pattern on a wafer substrate for implementing one or more embodiments of the present disclosure. The method 100 begins at step 102 by providing or receiving a substrate. The method 100 proceeds to step 104 by depositing a resist film on the substrate, for example, by a spin-on coating process. In the present disclosure, a resist is also referred to as a photo resist. The step 104 may include performing a dehydration process before applying the resist film on the substrate, which can enhance an adhesion of the resist film to the substrate. The dehydration process may include baking the substrate at a high temperature for a duration of time, or applying a chemical such as hexamethyldisilizane (HMDS) to the substrate. The step 104 may also include a soft bake (SB), which can increase a mechanical strength of the resist film. After step 104, the method 100 proceeds to step 106 for exposing the resist film deposited on the substrate by an exposing tool to form a latent image pattern on the resist film. The exposing tool may include an optical exposing tool, such as I-line (365 nm), deep ultraviolet (DUV), extreme ultraviolet (EUV), or X-ray exposing tool, or a charged particle tool such as an electron beam writer. The method 100 proceeds to step 108 by developing the exposed resist film to form a resist pattern on the wafer substrate. The step 108 may include a post expose bake (PEB), a post develop bake (PDB), or both. Additional steps can be provided before, during, and after the method 100, and some of the steps described can be replaced, eliminated, or moved around for additional embodiments of the method 100.

Referring now to FIGS. 2-6, diagrammatic cross-sectional side views of forming a resist pattern of a device 200 by the method 100 is illustrated according to one or more embodiments of the present disclosure. The resist pattern of the device 200 includes a substrate 202 and a resist film 204. The substrate 202 may include a wafer and a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

As shown in FIG. 2, after receiving the substrate 202, the resist film 204 is deposited on the substrate 202. The resist film 204 may include a positive tone resist or a negative tone resist. The resist film 204 may also include a single resist film or a multiple layer resist film. In one embodiment, the multiple layer resist film includes a topcoat layer on resist film. The topcoat layer is for immersion water resistance or EUV outgas reduction. Then, as shown in FIG. 3, the resist film 204 deposited on the substrate 202 is exposed by an optical exposing tool. Light 206 generated by the optical tool is projected on a mask 208. The light 206 includes I-line light, DUV light, EUV light, or X-ray light. The mask 208 blocks some of the light 206 to transfer a pattern of an IC design layout to the resist film 204. The mask 208 includes a binary mask or a phase shift mask (PSM). The phase shift mask may be an alternative phase shift mask (alt. PSM) or an attenuated phase shift mask (att. PSM). In the present disclosure, a mask is also referred to as a photomask or a reticle. Some of the light 206 is blocked by the mask 208, and some of the light 206 passes the mask 208 and is projected on the resist film 204, where it reacts with a photo sensitive chemical in the resist film 204 to form a latent image. For example, the photo sensitive chemical is a photo acid generator (PAG) in a DUV resist. The PAG releases an acid under a radiation of the light 206 and forms the latent image. The PAG in the resist releases the acid under the radiation of the light 206 and the acid promotes a chemical amplify reaction (CAR) in an exposed area, for example, during a PEB process. Because of the chemical amplified reaction (CAR), a polarity of the resist in the exposed areas changes from hydrophobic polarity to hydrophilic polarity.

As shown in FIG. 4, a developer 210 is applied to the exposed resist film 204 deposited on the substrate 202 for developing a resist pattern. In the depicted embodiment, the final resist pattern depends on the developer tone. For example, if the developer 210 is a positive tone developer (PTD) such as tetramethylammonium hydroxide (TMAH) applied to the exposed resist film 204, the exposed (hydrophilic) portions of the resist film 204 are dissolved by the PTD during the developing process and the unexposed (hydrophobic) portions of the resist film 204 remain to form a patterned resist film 204a, providing the final resist pattern shown in FIG. 5. In another example, if the developer 210 is a negative tone developer (NTD) such as a hydrophobic organic solvent applied to the exposed resist film 204, the unexposed (hydrophobic) portions of the resist film 204 are dissolved by the NTD and the exposed (hydrophilic) portions of the resist film 204 remain after the developing process to form a patterned resist film 204b, providing the final resist pattern shown in FIG. 6.

Figure 7:
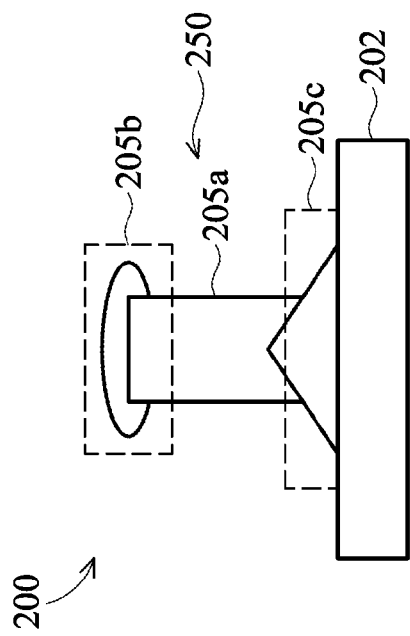

Continuing with the present embodiments, FIG. 7 illustrates a typical resist profile 205 when the resist film 204 is developed by a negative tone developer (NTD) according to one or more embodiments of the present disclosure. In the present disclosure, a negative tone developer is also referred to as an organic solvent developer. The resist profile 205 includes a straight middle portion 205a, a top scum portion (T-top) 205b, and a bottom scum portion (footing) 205c on the substrate 202. The T-top 205b and the footing 205c are caused by a non-uniform exposure of the resist film 204 during the exposing process, such as during the exposing in step 106 of the method 100 shown in FIG. 1, and further illustrated in FIG. 3. For example, during the exposing process, because light scatters at the surface of the resist film 204, a top area (in unwanted exposure area) of the resist film 204 may be partially exposed by the scattering light. Therefore, the partial exposed top area (in unwanted exposure area) cannot be removed by the negative tone developer (NTD) during the developing process and the T-top 205b on top of the straight middle portion 205a is formed. In another example, during the exposing process, because the light may reflect and scatter at the interface of the substrate 202 and the resist film 204, a bottom area (in unwanted exposure area) of the resist film 204 may be partially exposed by the scattering light or the reflective light. Thus, the partial exposed bottom area cannot be dissolved during the developing process and the footing 205c is formed. Because of the light scattering and/or reflecting at the top and at the bottom of the resist film 204, the resist film 204 receives different energy doses at different portions, and therefore the resist film forms a resist latent profile with different polarity at the top, middle, and bottom of the resist film 204. The different polarity may have different solubility to the same negative tone developer (NTD) and therefore the resist profile 205 with the T-top 205b and the footing 205c as shown in FIG. 7 is formed.

Figure 8:
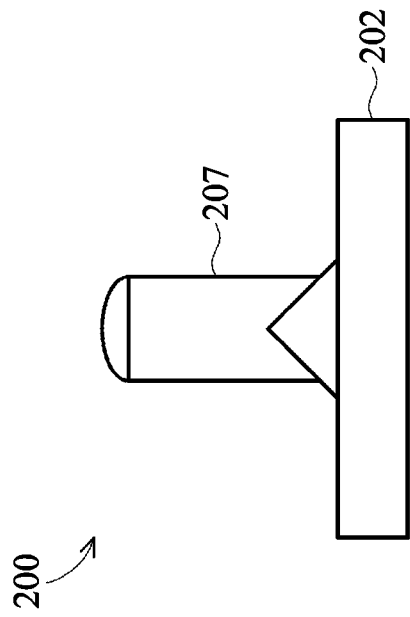
FIGS. 7-8 represent a resist profile after a developing process according to one or more embodiments of the present disclosure.

Referring now to FIG. 8, an improved resist profile 207 is illustrated by using multiple negative tone developers (NTD) during the developing process, according to one or more embodiments of the present disclosure. The T-top 205b and the footing 205c are reduced. By using multiple negative tone developers (NTD), the resist profile 207 on the substrate 202 is formed. During the developing process, a first negative tone developer (NTD) is applied to the exposed resist film 204 deposited on the substrate 202. The first negative tone developer (NTD) targets the middle portion of the exposed resist film 204. Then, a second negative tone developer (NTD) with more polar and stronger solubility than the first negative tone developer (NTD) is applied to target the partial exposed top (T-top) and bottom (footing). After that, a third negative tone developer (NTD) with different polarity (for example, from the first and second negative tone developers) is applied to target the partial exposed bottom (footing) or used as a rinse for defect reduction. The polarity of the multiple negative tone developers (NTD) can be chosen from a plurality of organic solvents with a different polarity to control the resist profile 207. For example, if more polar organic solvent is used as the third negative tone developer (NTD), the resist profile 205b can change from the T-top or top scum to rounding.

Figure 9:
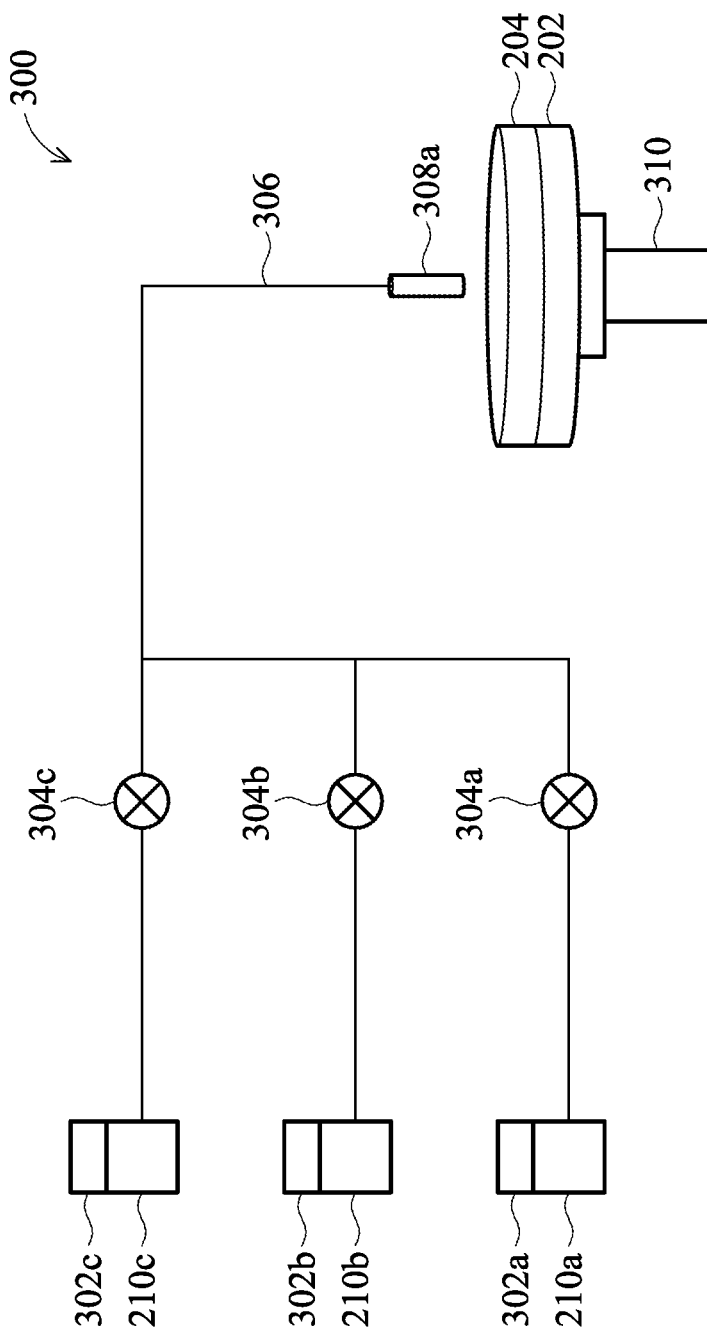
FIG. 9 is a diagram of a developing apparatus for implementing one or more embodiments of the present disclosure

Referring now to FIG. 9, a diagram of an apparatus 300 for dispensing multiple organic solvent developers to form a resist pattern on a substrate is illustrated for implementing one or more embodiments of the present disclosure. The apparatus 300 includes tanks 302a, 302b, and 302c; pumps 304a, 304b, and 304c; tubing 306; a nozzle 308a; and a chuck 310. However, other configurations and inclusion or omission of devices may be possible. In the present disclosure, a pump is also referred to as a valve. The tanks 302a, 302b, and 302c each store an organic solvent developer with different polarity. For example, the tank 302a stores an organic solvent developer 210a, the tank 302b stores an organic solvent developer 210b, and the tank 302c stores an organic solvent developer 210c respectively. In an example, the organic solvent developer 210a has a polarity less than the organic solvent developers 210b and 210c, and the organic solvent developer 210b has a polarity less than the organic solvent developer 210c. The tanks 302a-302c are respectively connected to the pumps 304a-304c through the tubing 306. The tank 302a is connected to the pump 304a, the tank 302b is connected to the pump 304b, and the tank 302c is connected to the pump 304c. In the depicted embodiment, all pumps 304a, 304b, and 304c are connected to the nozzle 308a through the tubing 306. The tubing 306 includes any element or combination of elements that facilitate transporting the organic solvent developers 210a, 210b, and 210c from the tanks 302a, 302b, and 302c to the nozzle 308a. The nozzle 308a is located above the chuck 310. The nozzle 308a sprays the organic developer 210a; the organic developer 210b; the organic developer 210c; or a mixture of the organic developer 210a, the organic solvent developer 210b, and/or the organic developer 210c on the exposed resist film 204 deposited on the substrate 202 secured by the chuck 310. The chuck 310 is used to secure the substrate 202 deposited with the resist film 204 during the developing process. As shown in FIG. 9, the individual organic solvent developers 210a, 210b, and 210c with different polarity can be delivered separately to the resist film 204 deposited on the substrate 202 during a developing process, or a mixture of the individual organic solvent developers 210a, 210b, and 210c can be delivered to the resist 204 deposited on the substrate 202. The pumps 304a, 304b, and 304c control a developing process recipe of the developing process, such as a flow and amount of each of the organic solvent developers 210a, 210b, and 210c delivered to the nozzle 308a via the tubing 306. It is noted that, in the depicted embodiment, the apparatus 300 is configured such that the nozzle 308a distributes three different organic solvent developers. The apparatus 300 may be configured such that the nozzle 308a distributes two different organic solvent developers or more than three different organic solvent developers, where a pump is associated with each organic solvent developer to be distributed by the nozzle 308a. Further, the tanks may hold developers other than organic solvent developers.

In an example, after the resist film 204 is deposited on the substrate 202 and the resist film 204 is exposed, the exposed resist film 204 is transferred to the chuck 310 of the apparatus 300 for a developing process. First, the first organic solvent developer 210a, such as methyl a-amyl ketone (MAK), is delivered from the tank 302a to the nozzle 308a through the tubing 306 by turning on the pump 304a, and the organic solvent developer 210a is sprayed on the exposed resist film 204 by the nozzle 308a to target development of the top portion of the exposed resist film 204. Then, the pump 304a is shut off and the second organic solvent developer 210b, such as n-butyl acetate (NBA), is delivered from the tank 302b to the nozzle 308a through the tubing 306 by turning on the pump 304b, and the organic solvent developer 210b is sprayed on the exposed resist film 204 to target development of the middle portions of the exposed resist film 204. In the present example, the organic solvent developer 210a has a greater polarity than the organic solvent developer 210b. In another example, if the pump 304a and the pump 304b are turned on at the same time, a mixture of the organic solvent developer 210a and the organic solvent developer 210b (e.g. a mixture of MAK and NBA) is delivered to the nozzle 308a through the tubing 306, and the mixture of the organic solvent developers 210a and 210b is sprayed on the exposed resist film 204 for developing the exposed resist film 204. A ratio of the mixture (e.g. 50% NBA and 50% MAK) can be controlled by a flow rate ratio of the pump 304a to the pump 304b. Eventually, both the pump 304a and the pump 304b are shut off, and the third organic developer 210c, such as an alcohol, methyl isobutyl carbinol (MIBC) or surfactant mixture, is delivered from the tank 302c to the nozzle 308a through the tubing 306, and the third organic developer 210c, is sprayed on the exposed resist film 204 for further developing the exposed resist film 204. The third organic or water base developer 210c may also serve as a final rinse, which can reduce the develop residue defect. The final resist profile 207 on the substrate is formed as shown in FIG. 8.

Figure 10:
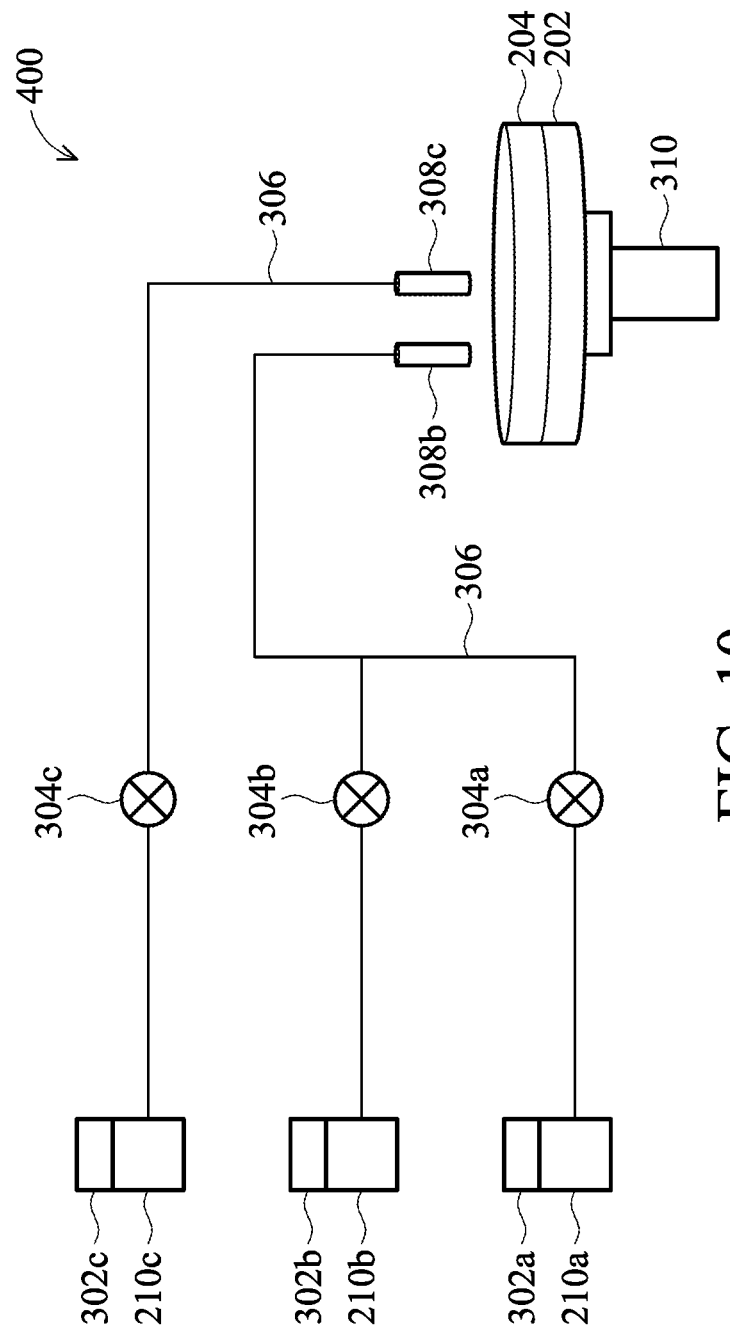
FIG. 10 is a diagram of a developing apparatus for implementing one or more embodiments of the present disclosure.

Referring now to FIG. 10, a diagram of an apparatus 400 for dispensing multiple organic solvent developers to form a resist pattern on a substrate is illustrated for implementing one or more embodiments of the present disclosure. The apparatus 400 includes the tanks 302a, 302b, and 302c; the pumps 304a, 304b, and 304c; tubing 306; nozzles 308b and 308c; and the chuck 310. However, other configurations and inclusion or omission of devices may be possible. The tanks 302a, 302b, and 302c each store an organic solvent developer with a different polarity. For example, the tank 302a stores the organic solvent developer 210a, the tank 302b stores the organic solvent developer 210b, and the tank 302c stores the organic solvent developer 210c. The tanks 302a-302c are respectively connected to the pumps 304a-304c through the tubing 306. The tank 302a is connected to the pump 304a, the tank 302b is connected to the pump 304b, and the tank 302c is connected to the pump 304c. The pump 304a and the pump 304b are connected to the nozzle 308b through the tubing 306. The pump 304c is connected to the nozzle 308c through the tubing 306. The tubing 306 includes any element or combination of elements that facilitate transporting the organic solvent developers 210a, 210b, and 210c from the tanks 302a and 302b to the nozzle 308b and the tank 302c to the nozzle 308c. Both the nozzle 308b and the nozzle 308c are located above the chuck 310. The nozzle 308b sprays the organic solvent developer 210a, the organic solvent developer 210b, or a mixture of the organic solvent developer 210a and the organic solvent developer 210b on the exposed resist film 204 deposited on the substrate 202 secured by the chuck 310. The nozzle 308c sprays the organic solvent developer 210c on the exposed resist film 204 deposited on the substrate 202 secured by the chuck 310. The chuck 310 is used to secure the substrate 202 deposited with the resist film 204 during the developing process. As shown in FIG. 10, the organic solvent developers with different polarities 210a, 210b and 210c can be delivered separately to the resist film 204 during the developing process, or a mixture of the organic solvent developers 210a, 210b, and/or 210c can be delivered to the resist film 204 controlled by processing recipe. It is noted that, in the depicted embodiment, the apparatus 400 is configured such that the nozzle 308b distributes two different organic solvent developers, and the nozzle 308c distributes one organic solvent developer. The apparatus 400 may be configured such that the nozzle 308c distributes more than one organic solvent developer, where a pump is associated with each organic solvent developer to be distributed by the nozzle 308c. Further, the tanks may hold developers other than organic solvent developers.

In an example, after the resist film 204 is deposited on the substrate 202 and the resist film 204 is exposed, the exposed resist film 204 deposited on the substrate 202 is transferred to the chuck 310 of the apparatus 400 for the developing process. The organic solvent developer 210a, such as n-butyl acetate (NBA), is delivered from the tank 302a to the nozzle 308b through the tubing 306 by turning on the pump 304a, and thereafter, the organic solvent developer 210a is sprayed on the exposed resist film 204 by the nozzle 308b to target development of the middle portion of the exposed resist film 204. Then, the pump 304a is shut off and the more polar second organic solvent developer 210b, such as methyl a-amyl ketone (MAK), is delivered from the tank 302b to the nozzle 308b through the tubing 306 by turning on the pump 304b, and thereafter, the organic solvent developer 210b is sprayed on the exposed resist film 204 to target development of the top and the bottom portions of the exposed resist film 204. In another example, if the pump 304a and the 304b are turned on at the same time, the mixture of the organic solvent developer 210a and the organic solvent developer 210b (e.g. the mixture of NBA and MAK) is delivered to the nozzle 308b through the tubing 306, and the mixture of the organic solvent developers 210a and 210b is sprayed on the exposed resist film 204 to target development of the top and bottom portions of the exposed resist film 204. A ratio of the mixture (e.g. 50% NBA and 50% MAK) can be controlled by a flow rate ratio of the pump 304a to the pump 304b. Eventually, both the pump 304a and the pump 304b are shut off and the third organic solvent developer 210c, such as an alcohol, is delivered from the tank 302c to the nozzle 308c through the tubing 306, and the third organic solvent developer 210c is sprayed on the exposed resist film 204 to target development of the bottom portion the exposed resist film 204. The third organic solvent developer 210c may also serve as a final rinse, which can reduce the develop residue defect. The final resist profile 207 on the substrate is formed as shown in FIG. 8.

Thus, the present disclosure describes a apparatus. In one embodiment, the apparatus includes a chuck configured for securing the substrate having the resist film deposited thereon; a first tank configured for storing a first developer of a first polarity; a second tank configured for storing a second developer of a second polarity, the second polarity being different than the first polarity; a first pump coupled to the first tank; a second pump coupled to the second tank; and a nozzle coupled to the first pump and the second pump, wherein the first pump is configured to deliver the first developer from the first tank to the nozzle and the second pump is configured to deliver the second developer from the second tank to the nozzle, and further wherein the nozzle is configured to distribute the first developer and the second developer to the resist film deposited on the substrate. The apparatus also includes tubing connecting the first and second tanks respectively with the first and second pumps, and further connecting the first and second pumps with the nozzle. The apparatus further includes a third tank configured for storing a third developer of a third polarity, the third polarity being different than the first polarity and the second polarity and a third pump coupled to the third tank; wherein the nozzle is further coupled to the third pump, wherein the third pump is configured to deliver the third developer from the third tank to the nozzle, and the nozzle is further configured to distribute the third developer to the resist film deposited on the substrate. The apparatus includes a first nozzle and a second nozzle, the first nozzle being coupled with the first pump and the second pump, such that the first nozzle is configured to distribute the first developer and the second developer to the resist film, and the second nozzle being coupled with the third pump, such that the second nozzle is configured to distribute the third developer to the resist film. The first pump is configured to control a flow rate of the first developer delivered to the nozzle and the second pump is configured to control a flow rate of the second developer delivered to the nozzle. The nozzle is configured to distribute a mixture of the first developer and the second developer to the resist film deposited on the substrate.

The present disclosure also describes an application for a apparatus. In one embodiment, a method for forming a resist pattern includes depositing a resist film on a substrate; exposing the resist film deposited on the substrate; applying a first developer with a first polarity to the exposed resist film; and applying a second developer with a second polarity to the exposed resist film. The second polarity is different than the first polarity and is smaller than the first polarity. The method includes applying the first developer with the first polarity for removing top resist scum and then applying the second developer with the second polarity for developing a middle portion of the exposed resist film. The method also includes simultaneously applying the first developer and the second developer to the exposed resist film. The method further includes applying a third developer with a third polarity to the exposed resist film. The third polarity is different than the first polarity and the second polarity and the third polarity is greater than the second polarity. The method also includes simultaneously applying the first developer and the second developer; and thereafter, applying the third developer.

In another embodiment, a method for forming a resist pattern includes depositing a resist film on a substrate; exposing the resist film deposited on the substrate; distributing a first organic solvent developer with a first polarity on the exposed resist film; distributing a second organic solvent developer with a second polarity to the exposed resist film, wherein the second polarity is different than the first polarity; and distributing a third organic solvent developer with a third polarity on the exposed resist film, wherein the third polarity is different than the first polarity and the second polarity. The method includes distributing simultaneously the first organic solvent developer and the second organic solvent developer to the exposed resist film. The method also includes distributing the first organic solvent developer and the second organic solvent developer using a first nozzle of a developing apparatus and distributing the third organic solvent developer using a second nozzle of the developing apparatus. The method further includes performing a post exposure bake (PEB) process before distributing the first organic solvent developer, a post develop bake (PDB) process after distributing the first organic solvent developer, the second organic solvent developer, and the third organic solvent developer, or combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a resist pattern, the method comprising:
depositing a resist film on a substrate, wherein the resist film has a top surface and a bottom surface;
exposing, through a mask, the resist film deposited on the substrate to form a non-uniformly exposed latent resist profile within the resist film by light at least partially scattering at the top surface or the bottom surface, wherein the non-uniformly exposed latent resist profile includes a first portion of a first polarity and a second portion of a second polarity, wherein the first polarity is different from the second polarity; and
patterning a resist profile in the exposed resist film using a plurality of developers, the patterning including:
applying a first developer of the plurality of developers with the first polarity to the exposed resist film, wherein the first developer develops the first portion of the non-uniformly exposed latent resist profile; and
applying a second developer of the plurality of developers with the second polarity to the exposed resist film, and wherein the second developer develops the second portion of the non-uniformly exposed latent resist profile.

2. The method of claim 1, wherein the second polarity is smaller than the first polarity.

3. The method of claim 1, wherein the first portion includes a top portion of the non-uniformly exposed latent resist profile.

4. The method of claim 3, wherein the second portion includes a middle portion of the non-uniformly exposed latent resist profile.

5. The method of claim 1, further including simultaneously applying the first developer and the second developer to the exposed resist film.

6. The method of claim 1, wherein the patterning further includes applying a third developer of the plurality of developers with a third polarity to the exposed resist film, wherein the third polarity is different than the first polarity and the second polarity.

7. The method of claim 6, wherein the third polarity is greater that the first polarity.

8. The method of claim 6, further comprising:
simultaneously applying the first developer and the second developer to the exposed resist film; and
thereafter, applying the third developer to the exposed resist film.

9. A method for forming a resist pattern, the method comprising:
depositing a resist film on a substrate, wherein the resist film has a top surface and a bottom surface;
exposing, through a mask, the resist film deposited on the substrate to form a non-uniformly exposed latent resist profile within the resist film by light at least partially scattering at the top surface or the bottom surface, wherein the non-uniformly exposed latent resist profile includes a first portion exposed to a first energy dose and a second portion exposed to a second energy dose different than the first energy dose; and
patterning a resist profile in the exposed resist film using a plurality of organic solvent developers, the patterning including:
distributing a first organic solvent developer of the plurality of organic solvent developers with a first polarity on the exposed resist film, wherein the first organic solvent developer develops the first portion of the non-uniformly exposed latent resist profile;
distributing a second organic solvent developer of the plurality of organic solvent developers with a second polarity on the exposed resist film, wherein the second polarity is different than the first polarity, and wherein the second organic solvent developer develops the second portion of the non-uniformly exposed latent resist profile; and
distributing a third organic solvent developer of the plurality of organic solvent developers with a third polarity on the non-uniformly exposed latent resist profile, wherein the third polarity is different than the first polarity and the second polarity.

10. The method of claim 9, further including distributing simultaneously the first organic solvent developer and the second organic solvent developer to the exposed resist film.

11. The method of claim 9, further comprising distributing the first organic solvent developer and the second organic solvent developer using a first nozzle of a developing apparatus and distributing the third organic solvent developer using a second nozzle of the developing apparatus.

12. The method of claim 9, wherein the distributing the third organic solvent developer with the third polarity on the exposed resist film includes removing a bottom resist scum via the distributed third organic solvent developer.

13. The method of claim 9, further comprising performing a post exposure bake process before distributing the first organic solvent developer.

14. The method of claim 9, further comprising performing a post develop bake process after distributing the first organic solvent developer, the second organic solvent developer, and the third organic solvent developer.

15. A method for forming a resist pattern on a substrate, the method comprising:
depositing a resist film on the substrate, wherein the resist film has a top surface and a bottom surface;
exposing, through a mask, the resist film deposited on the substrate to form a non-uniformly exposed latent resist profile within the resist film, wherein the non-uniformly exposed latent resist profile includes a first portion exposed to a first energy dose provided by light at least partially scattering at the top surface or the bottom surface, and a second portion exposed to a second energy dose different than the first energy dose;
delivering a first developer of a first polarity through a nozzle;
delivering a second developer of a second polarity through the nozzle, the second polarity being different than the first polarity;
wherein the nozzle distributes the first developer and the second developer to the exposed resist film on the substrate.

16. The method of claim 15, further comprising:
delivering a third developer of a third polarity through the nozzle, the third polarity being different than the first polarity and the second polarity;
wherein the nozzle is further configured to distribute the third developer to the exposed resist film on the substrate.

17. The method of claim 15, wherein delivering the first developer with the first polarity includes applying a developer for developing the first portion of the exposed resist film.

18. The method of claim 15, wherein the delivering the second developer with the second polarity includes applying a developer for developing the second portion of the exposed resist film.

19. The method of claim 15, further including simultaneously applying the first developer and the second developer to the exposed resist film.

* * * * *